United States Patent
Wang et al.

(10) Patent No.: US 9,401,738 B2
(45) Date of Patent: Jul. 26, 2016

(54) METHOD FOR SIMPLIFIED CLOSED-LOOP ANTENNA TUNING

(71) Applicant: MEDIATEK Singapore Pte. Ltd., Singapore (SG)

(72) Inventors: James June-Ming Wang, San Marino, CA (US); Qiang Zhou, San Jose, CA (US); YungPing Hsu, Taipei (TW); Bernard Mark Tenbroek, Kent (GB)

(73) Assignee: MEDIATEK SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/799,413

(22) Filed: Jul. 14, 2015

(65) Prior Publication Data
US 2016/0020814 A1  Jan. 21, 2016

Related U.S. Application Data

(60) Provisional application No. 62/024,537, filed on Jul. 15, 2014, provisional application No. 62/045,088, filed on Sep. 3, 2014, provisional application No. 62/080,623, filed on Nov. 17, 2014.

(51) Int. Cl.
*H04B 1/40* (2015.01)
*H01Q 1/50* (2006.01)
*H01Q 5/335* (2015.01)

(52) U.S. Cl.
CPC . *H04B 1/40* (2013.01); *H01Q 5/335* (2015.01)

(58) Field of Classification Search
CPC ...... H04B 1/04; H04B 1/0458; H04B 1/0053; H04B 1/40; H04B 1/48; H03H 7/38; H01Q 1/50; H01Q 1/241; H01Q 5/335; H01Q 13/103; H01Q 19/10
USPC ............. 455/67.11, 77, 78, 423, 425, 550.1; 343/787, 860, 861, 876
See application file for complete search history.

(56) References Cited

U.S. PATENT DOCUMENTS

| | | | | |
|---|---|---|---|---|
| 7,061,430 B2 * | 6/2006 | Zheng | ..................... | H01Q 1/243 343/846 |
| 8,638,266 B2 * | 1/2014 | Liu | ...................... | H01Q 9/0421 343/767 |
| 9,203,500 B2 * | 12/2015 | Danak | ...................... | H04B 1/40 |

(Continued)

OTHER PUBLICATIONS

International Search Report and Written Opinion of International Search Authority for PCT/SG2015/050214 dated Oct. 23, 2015(9 pages).

*Primary Examiner* — Quochien B Vuong
(74) *Attorney, Agent, or Firm* — Imperium Patent Works; Zheng Jin

(57) ABSTRACT

A method of closed-loop antenna tuning (CLAT) search strategy based on maximum Relative Transducer Gain (RTG) is proposed. A search region that account for TX input mismatch and forward voltage gain is pre-computed. The search region that is independent of antenna load can be pre-computed to reduce the computation complexity. The Maximum RTG is searched by estimating antenna S-parameters corresponding to a good load match. The search is conducted between the peak forward voltage gain and the best load match. Global optimal with reasonable RTG can be found with limited number of iterations. The transmitter search region can further be constrained by the receiver path mismatching.

23 Claims, 7 Drawing Sheets

(56) References Cited

U.S. PATENT DOCUMENTS

| | | | |
|---|---|---|---|
| 9,231,730 B2 * | 1/2016 | Yoshikawa | H04B 7/0682 |
| 2011/0086598 A1 | 4/2011 | Ali et al. | 455/115.1 |
| 2011/0189964 A1 | 8/2011 | Jeon et al. | 455/114.2 |
| 2012/0119842 A1 | 5/2012 | Gu et al. | 333/17.3 |
| 2012/0293187 A1 | 11/2012 | Morris, III | 324/649 |
| 2012/0293249 A1 | 11/2012 | Lee | 327/560 |

* cited by examiner

METHOD FOR SIMPLIFIED CLOSED-LOOP ANTENNA TUNING

CROSS REFERENCE TO RELATED APPLICATIONS

This application claims priority under 35 U.S.C. §119 from U.S. Provisional Application No. 62/024,537 entitled "CLAT Algorithm Simplification," filed on Jul. 15, 2014, the subject matter of which is incorporated herein by reference.

TECHNICAL FIELD

The disclosed embodiments relate generally to wireless communications, and, more particularly, to Closed-Loop Antenna Tuning.

BACKGROUND

An antenna tuner is a device connected between a radio frontend electronics (transmitter and/or receiver) and its antenna to improve power transfer between them by matching the impedance of the radio frontend electronics to the antenna. An antenna's impedance can be different at different frequencies and influenced by object close-by. An antenna tuner matches a radio frontend electronics with a fixed impedance (typically 50 Ohms for modern transceivers) to the impedance of the antenna, which is influenced by human contact or objects in proximity, thus different from the impedance of the transceiver. There are many different implementations of antenna tuners using broadband matching, narrow band design, or other complex designs.

For mobile wireless devices, closed-loop antenna tuning (CLAT) can extend battery life and improve user experience by monitoring the antenna impedance changes and adjusting the tuner state to achieve improved matching. For example, the RF performance due to mismatch between the antenna and the transceiver cause a power loss of approximately −1 dB, human body phantoms (e.g., head and hand) cause another −3 dB power loss, and real-life (e.g., many user conditions) cause up to −7 dB power loss. In order to maximize the delivered power from the source (radio transceiver) to the load (antenna), or vice versa, maximum transducer gain of the antenna is desired. To implement closed-loop antenna tuner, a coupler between the radio frontend electronic and antenna is typically incorporated to sample the RF path signal in both the forward (radio frontend electronics to antenna) and reverse direction (antenna to radio frontend electronics. By comparing forward path signal and reverse path signal, the reflection coefficient can be estimated. The CLAT searching algorithm thus involves searching an optimal antenna tuner setting to maximize the transducer gain of the antenna.

The current CLAT searching algorithm has several issues. The tuner has a large number of settings (e.g., half a million states). First, the gradient-type search method might converge on local optimum, not global optimum. Second, extensive search is computational intensive. Third, the simplified search still requires 1K to 4K iterations. A simplified CLAT search algorithm with global optimum is sought.

SUMMARY

A method of closed-loop antenna tuning (CLAT) search strategy based on maximum Relative Transducer Gain (RTG) is proposed. The large number of states in the tuner search space can be transformed into the S parameter values in the Smith chart and in the process removing redundant states and ill-values states. A search region in the new search space that account for TX input mismatch and forward voltage gain could be further quantized to achieve drastic reduction of the number of states. The transformation and quantization of the search region that is independent of antenna load can be pre-computed to reduce the computation complexity. The Maximum RTG is searched by estimating antenna S-parameters within the search region corresponding to a good load (antenna) match. The search is conducted between the peak forward voltage gain and the best load match. Global optimal with reasonable RTG can be found with small number of iterations. The search region is further constrained by the limiting the amount of receiver path mismatching. Furthermore, the method can be extended to support carrier aggregation by constraining the search region to the union of multiple search regions corresponding to different carrier frequencies.

In one embodiment, a wireless device constructs a Smith chart for an antenna with an antenna tuner having S-parameters including S11, S12, S21, and S22. The wireless device determines a search region of S22 on the Smith chart that satisfies a condition. The search region is pre-computed because the condition is independent from the load condition of the antenna tuner. In one example, the condition indicates an input reflection coefficient ($\Gamma_{in}$) of the antenna tuner is smaller than a threshold value. The wireless device estimates a load reflection coefficient ($\Gamma_L$) of the antenna tuner. Finally, the wireless device searches a set of S-parameters that corresponds to a maximum relative transducer gain (RTG) of the antenna on the Smith chart within the search region. The search is conducted along a search path that is located inside a final search region formed between a peak |S21| and $\gamma_L^*$ on the Smith chart.

Other embodiments and advantages are described in the detailed description below. This summary does not purport to define the invention. The invention is defined by the claims.

DETAILED DESCRIPTION

Reference will now be made in detail to some embodiments of the invention, examples of which are illustrated in the accompanying drawings.

Figure 1:
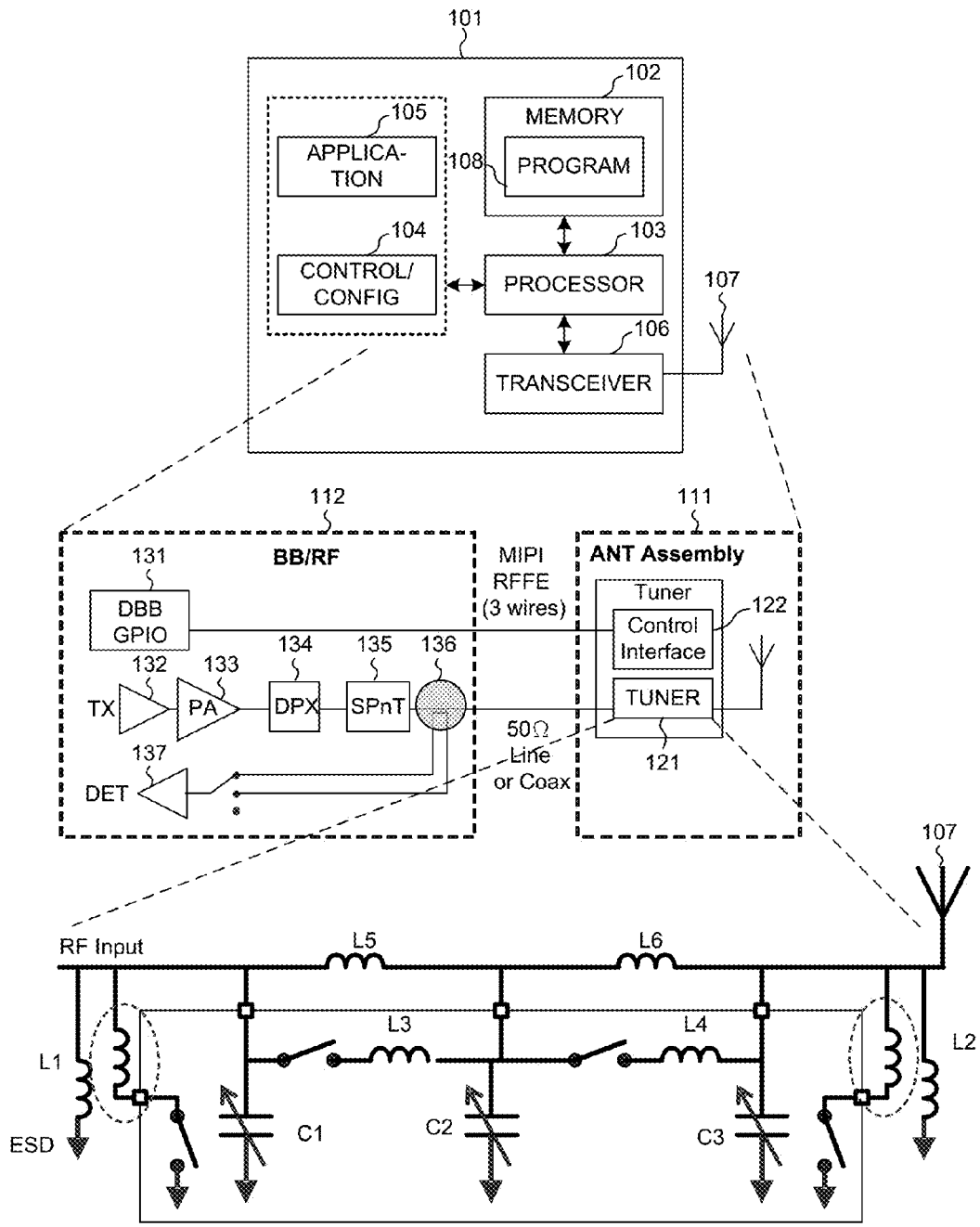
FIG. 1 illustrates a wireless device having an antenna with an antenna tuner supporting simplified closed-loop antenna tuning (CLAT) algorithm in accordance with one novel aspect.

FIG. 1 illustrates a wireless device 101 having an antenna with an antenna tuner supporting simplified closed-loop antenna tuning (CLAT) algorithm in accordance with one novel aspect. Wireless device 101 comprises memory 102 that contains data and program 108, a processor 103, a control and configuration module 104, an application module 105, and a radio frequency (RF) transceiver 106 coupled to antenna 107. Memory 102 stores program instructions and data 108 to control the operations of the wireless device via processor 103. In the transmitting direction, the RF transceiver converts the baseband signals from the processor to RF signals and sends out to the antenna. In the receiving direction, the processor processes the received baseband signals from the RF transceiver and invokes different functional modules to perform various features and embodiments supported by the wireless device.

In one embodiment, the wireless device 101 is implemented by an antenna assembly 111 and a baseband/radio frequency (BB/RF) module 112. Antenna assembly 111 comprises an antenna tuner 121 and a control interface 122. BB/RF 112 comprises a digital baseband general purpose IO (DBB GPIO) 131, a transmitter TX 132, a power amplifier PA 133, a Diplexer DPX 134, a single-pole N-throw switch SPnT 135, a coupler 136, and a selector/detector DET 137. On the source side, the antenna tuner 121 is coupled to the RF input (e.g., radio transmitter TX 132 and power amplifier 133). On the load side, the antenna tuner 121 is coupled to antenna 107. Note that the coupler 136 couples the signal in the forward path (from single-pole N-throw switch SPnT 135 to tuner 121) and in the reverse path (from tuner 121 to the single-pole N-throw switch SPnT 135). The selector/detector DET 137 can sample the forward path and reverse path signal. In one embodiment, the antenna tuner 121 further comprises a plurality of tunable capacitors C1, C2, C3, and a plurality of inductors L1, L2, L3, and L4 controlled by corresponding switches.

An antenna tuner matches a radio with a fixed impedance (typically 50 Ohms for modern transceivers) to an antenna. For closed-loop antenna tuning (CLAT), the goal is to find the optimum settings of the capacitors and the inductors to achieve maximum transducer gain. In the example of the FIG. 1, each capacitor can be tuned by a 5-bit number for its capacitance, while each inductor is controlled by an ON/OFF switch. As a result, the total number of possible settings of the antenna tuner can reach approximately half a million states. Extensive search within the possible tuner states is thus required to achieve a global optimum setting for maximum transducer gain. The first order simplification is to transform the search space from tuner states into corresponding S parameter values in the S parameter space. Note that a number of tuner states can be transformed into the same S parameter values. Only one tuner state among the redundant tuner states needs to be retained. The selection can be based on common practices in the art of RF design such as avoiding ill-conditioned state that can lead to large errors due to variations in component value. Thus, by transforming from tuner state to S parameter state, a large number of tuner states can be removed. Additionally, the S parameter state can be quantized to further reduce the number of states in S parameter space to, say, a few thousand states.

In accordance with one novel aspect, a simplified CLAT search algorithm based on maximum RTG (relative transducer gain) and simultaneous conjugate match is proposed. Depending on the value of the load reflection coefficient on the Smith chart, a global optimum solution (if simultaneous conjugate match exists) can be obtained. Alternatively, near optimum solution or possibly optimum solution (if simultaneous conjugate match is not possible) can be obtained. Through some simplification, the search region (which is independent from antenna load) can be pre-computed to reduce the computation load. Predictable search path with broadband match can be found using extracted lumped element, which typically requires less than 100 iterations.

Figure 2:
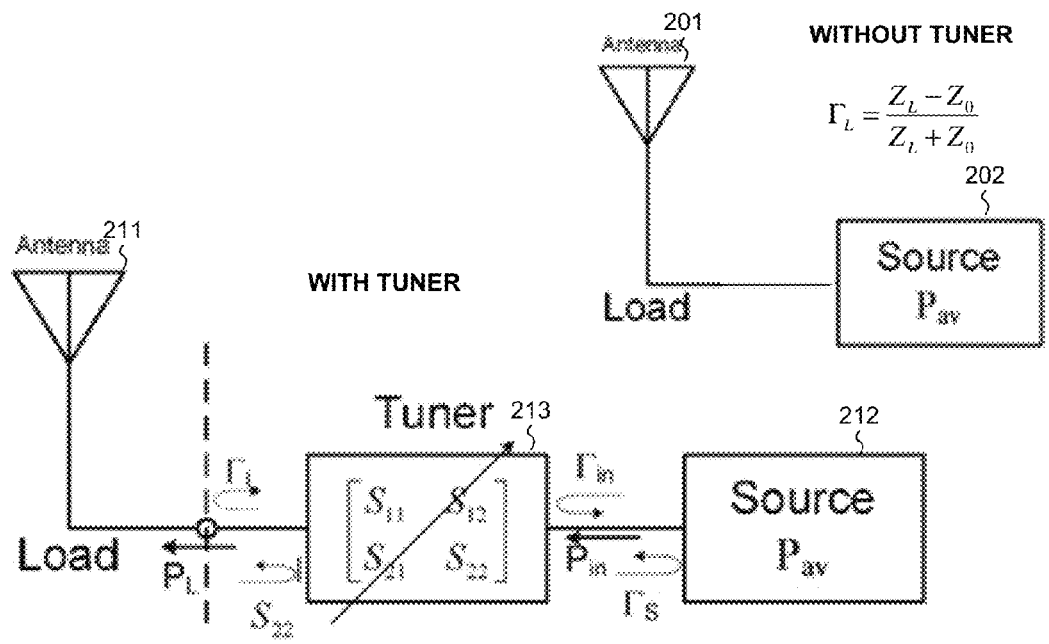
FIG. 2 illustrates the tuner position within the radio frontend electronics and antenna.

FIG. 2 illustrates transducer gain and relative transducer gain (RTG) of an antenna with or without an antenna tuner. The goal for an antenna is to maximize the delivered power from the source to the load, e.g., to maximize the Transducer Gain. For antenna 201 coupled to source 202, the definition of Transducer Gain (without tuner) is:

$$G_T = \frac{\text{Deliver powe to Load}}{\text{Available Power from Source}}$$
$$= \frac{|S_{21}|^2(1-|\Gamma_s|^2)(1-|\Gamma_L|^2)}{|1-\Gamma_s\Gamma_{in}|^2|1-S_{22}\Gamma_L|^2}$$
$$= \frac{(1-|\Gamma_s|^2)}{|1-\Gamma_s\Gamma_{in}|^2}|S_{21}|^2\frac{(1-|\Gamma_L|^2)}{|1-S_{22}\Gamma_L|^2}$$
$$= \text{input mismatch}*|S_{21}|^2\text{output mismatch}$$

where near perfect source matching is assumed:

$$G_T = \frac{|S_{21}|^2(1-|\Gamma_L|^2)}{|1-S_{22}\Gamma_L|^2}$$
$$\Gamma_s = \frac{Z_s - Z_0}{Z_s + Z_0} \approx 0$$

For antenna 211 coupled to source 212 via antenna tuner 213, the definition of Relative Transducer Gain (RTG) (with tuner) is:

$$RTG = \frac{\text{Incident power to antenna w/ tuner}}{\text{Incident power to antenna w/o tuner}}$$
$$= \frac{|S_{21}|^2}{|1-S_{22}\Gamma_L|^2}$$

Where
$\Gamma_s$ is the source reflection coefficient
$\Gamma_L$ is the load reflection coefficient
$\Gamma_{in}$ is the input reflection coefficient
$\Gamma_{out}$ is the input reflection coefficient
S11 is the input port voltage reflection coefficient
S12 is the reverse voltage gain
S21 is the forward voltage gain
S22 is the output port voltage reflection coefficient
Simultaneous conjugate match exists when $\Gamma_s=\Gamma_{in}*$, and $\Gamma_L=\Gamma_{out}*$. For unilateral case (S12=0), then $\Gamma_s=S_{11}*$, and $\Gamma_L=S_{22}*$. However most tuner implementations are bi-lateral (S12≠0). For bilateral case (S12≠0), then the input and output reflections depend on each other:

$$\Gamma_{in} = \frac{S_{21}\Gamma_L S_{12}}{1 - S_{22}\Gamma_L} + S_{11}$$

$$\Gamma_{out} = \frac{S_{21}\Gamma_S S_{12}}{1 - S_{11}\Gamma_S} + S_{22}$$

It is reasonable to assume that, at maximum transducer gain, the input and output mismatches are small. That is, the following conditions are satisfied:

$$\Gamma_S \cong 0 \Rightarrow S_{22} \cong \Gamma_L^*$$

$$\Rightarrow |\Gamma_{in}| = \left|\frac{S_{21}\Gamma_L S_{12}}{1 - S_{22}\Gamma_L} + S_{11}\right| \cong \left|\frac{S_{21}S_{22}^* S_{12}}{1 - |S_{22}|^2} + S_{11}\right| < \Delta$$

Thus, under this condition, the input reflection coefficient as seen from the source is independent of load. In one example, Δ=0.2.

As a result, we can search the region of S22 in the Smith chart that satisfies the above condition independent from load conditions. In other words, we need to find the codeword (the S-parameters is a function of codewords, and each codeword represents a specific antenna tuner settings/states) corresponding to $\Gamma_L$=S22* or S22=$\Gamma_L$* in order to achieve the maximum RTG. If $\Gamma_L$* is within the search region, then the search is straightforward. If $\Gamma_L$* is outside of the search region, then the solution should be between $\Gamma_L$* and the closest point at the border of the search region.

Figure 3:
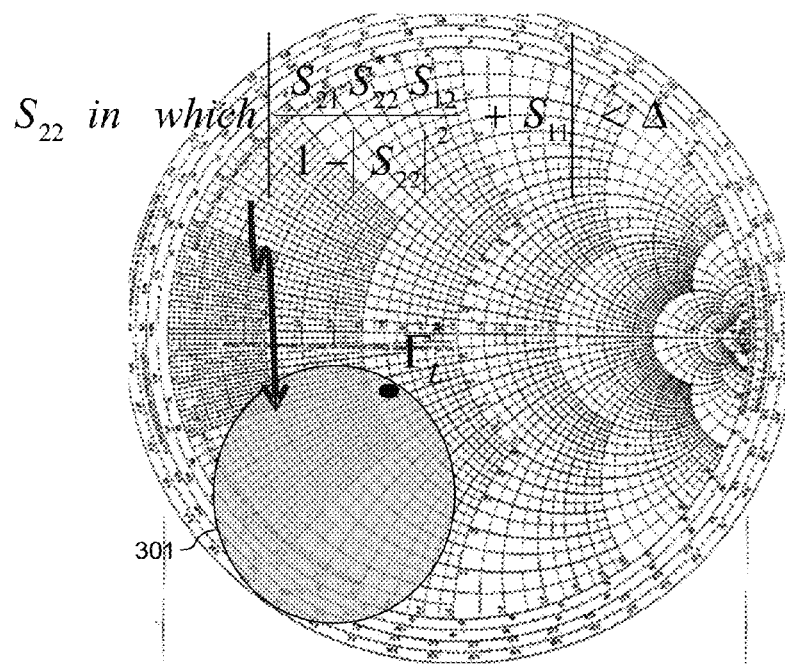
FIG. 3 illustrates a search region on the Smith chart for S22.

FIG. 3 illustrates a search region on the Smith chart for S22. The pre-computed search region indicates simultaneous matches at the source and the load. In the example of FIG. 3, the search region is a circle 301, which represents S22 that satisfies the condition of equation (1):

$$S_{22} \text{ in which } \left|\frac{S_{21}S_{22}^* S_{12}}{1 - |S_{22}|^2} + S_{11}\right| < \Delta \quad (1)$$

Figure 4:
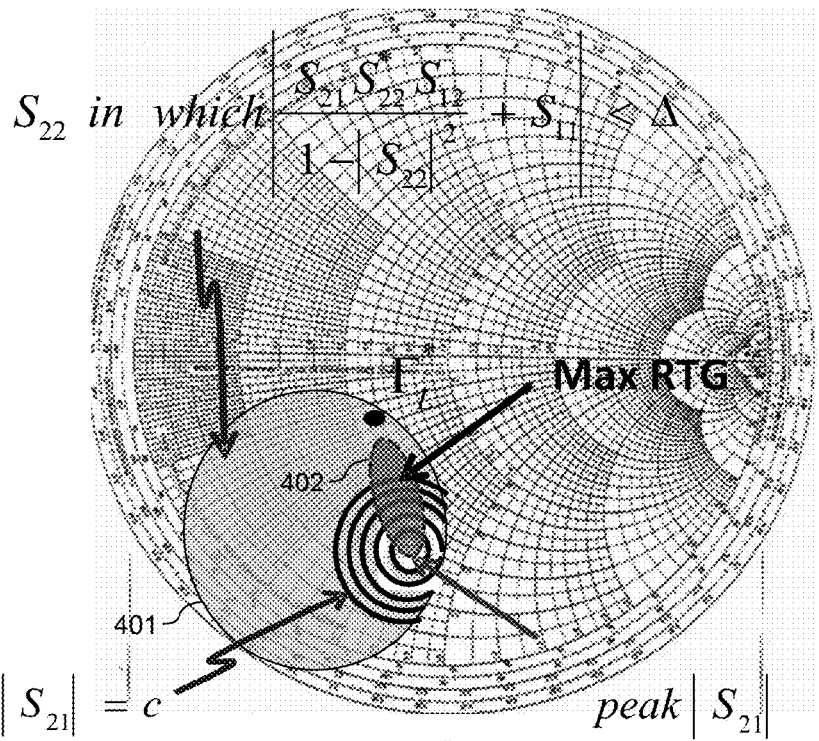
FIG. 4 illustrates the search region and maximum RTG on the Smith chart for S22.

FIG. 4 illustrates a search region and the maximum RTG on the Smith chart for S22. In the example of FIG. 4, the search region is a circle 401 that satisfies the same condition as equation (1). In one example, the value of Δ=0.2. In addition, the S22 contours corresponding to constant |S21|=C are also plotted, with a peak |S21| point located in the center of the S22 contours. It should be noted that the peak |S21| point corresponding to the case that antenna input impedance is nearly 50 ohm. If the conjugate load, $\Gamma_L$* is located within search region 401, the maximum RTG can be found somewhere between $\Gamma_L$* (the best load match) and the peak |S21| (voltage gain) in the final search region 402. Thus, pre-computed search region and constant S21 contours derived from approximation allows search to quickly narrow down to near maximum RTG region. Additional fine-search can still be conducted via simple gradient (or hill climbing) search to further refine the RTG. Note that the simplified search leads to a point that is very close to global optimum and further gradient type refinement search can avoid finding the local optimum.

Figure 5:
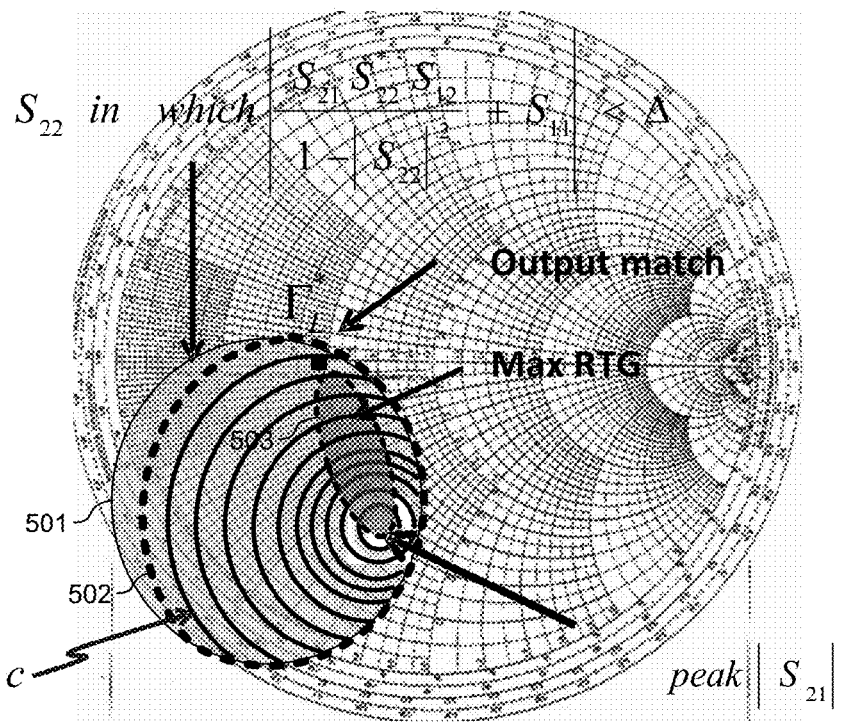
FIG. 5 illustrates one embodiment of how to search for maximum RTG on the Smith chart for S22.

FIG. 5 illustrates one embodiment of how to search for maximum RTG on the Smith chart for S22. In the example of FIG. 5, the search region is a circle 501 that satisfies the same condition as equation (1). The search region can be pre-computed based on the condition because it is independent from the load condition. The contours of constant |S21|=C within the search region can also be pre-computed and plotted on the Smith chart. The actual search area is limited by the union of the constant contours and the input mismatch boundary as depicted by dashed line 502. The final search region is depicted by dashed line 503, and the maximum RTG can be found somewhere between $\Gamma_L$* and the peak |S21| in the final search region 503.

Figure 6:
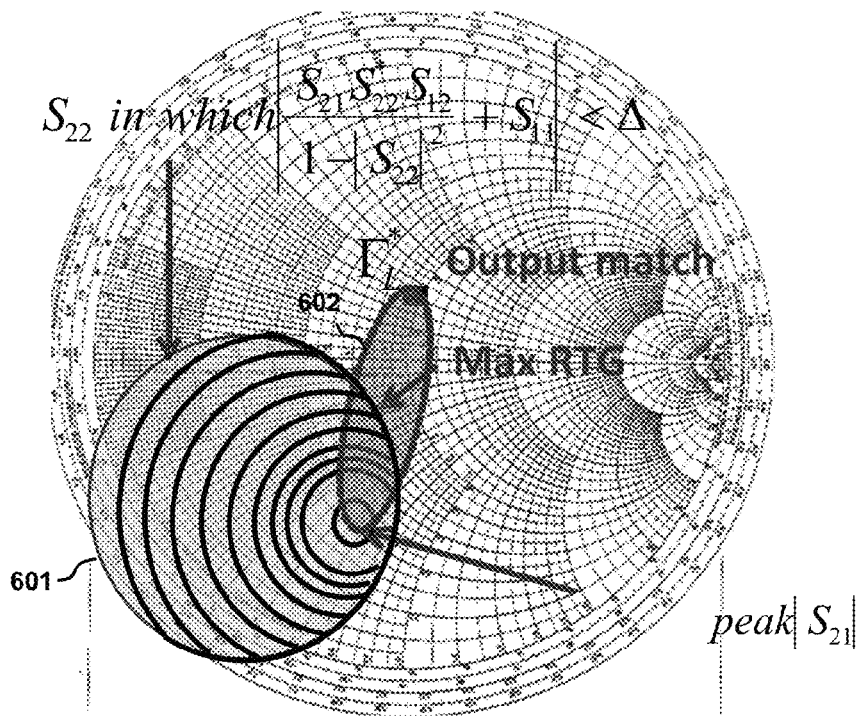
FIG. 6 illustrates how to search for maximum RTG on the Smith chart for S22 when the load reflection coefficient is outside the search region.

FIG. 6 illustrates how to search for maximum RTG on the Smith chart for S22 when the load reflection coefficient $\Gamma_L$* is outside the search region. When $\Gamma_L$* is outside the search region 601, the final search area 602 is modified as depicted in FIG. 6. The search result for maximum RTG can be between the closest point in the search region to IV. It can result in slight mismatch at the source and the load but the antenna tuner should still have decent RTG.

Figure 7:
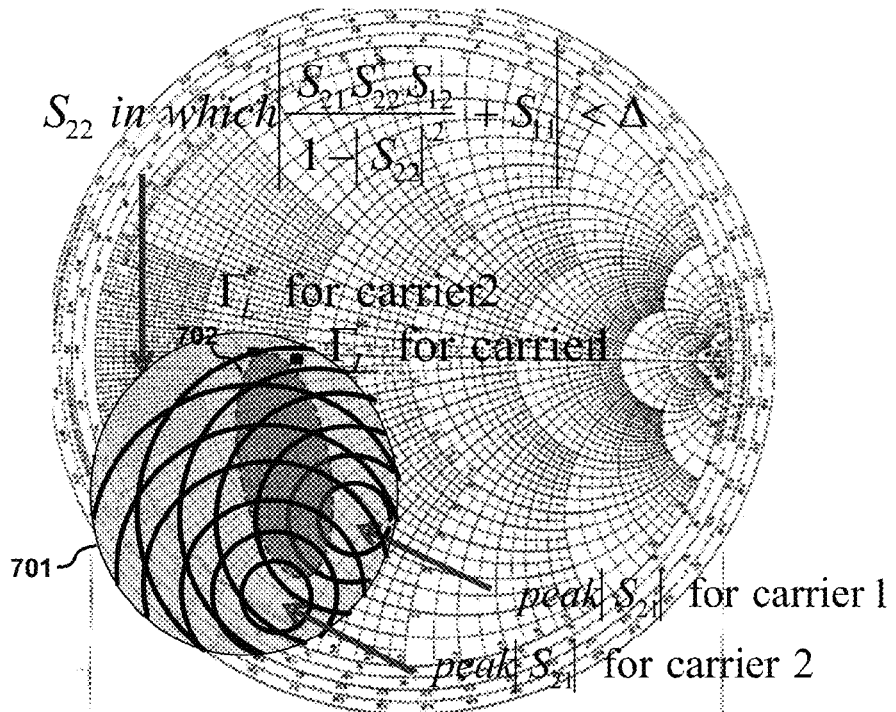
FIG. 7 illustrates different search regions under carrier aggregation.

FIG. 7 illustrates different search regions and composite search region on the Smith chart for S22 under carrier aggregation. For carrier aggregation scenario, multiple search regions 701 can be defined, one for each carrier. In the example of FIG. 7, the contours of constant |S21|=C for carrier 1 as well as the contours of constant |S21|=C for carrier 2 are independently plotted. In addition, the composite search region 702 is determined based on the peak |S21| point for carrier 1 and $\Gamma_L$* for carrier 1, as well as the peak |S21| point for carrier 2 and $\Gamma_L$* for carrier 2.

The load reflection coefficient $\Gamma_L$ can be estimated based on the input reflection coefficient $\Gamma_{in}$ measurements. For example, $$\Gamma_{L\_Estimated} = \frac{\Gamma_{In\_Estimated} - S_{11}}{S_{21}S_{12} - S_{11}S_{22} + \Gamma_{In\_Estimated} S_{22}}$$

Referring back to FIG. 1, the antenna tuner 121 has approximately half a million states for the different capacitor and inductor settings, each is represented by a codeword. As a result, we have a large Lookup Table (LUT) between the S-parameters and the codewords: S-parameters=f(codeword), where each codeword represents a specific antenna tuner setting/state (e.g., capacitance of each capacitor C1/C2/C3 and on-off switch state of each inductor L of tuner 121 in FIG. 1). If the entire LUT for S22 vs. codeword is available, then S22=$\Gamma_L$* can be found. Search all the tuner states to find the best S22 is computational intensive. A simple approach for simplification is to use lumped element model to assist in search and adjust the capacitors and the switches to get to S22=$\Gamma_L$*. Using lumped element model limits the number of states in the search since it follows the certain trajectory in the Smith chart. It also allows broadband match to be found among multiple solutions. If lumped element model is used, then S22 can be computed from C, L, switch values. The search traverses the path of shunt C or series L "circles" in the Smith chart (change C1, C2, C3, or change the switch for series L). Multiple trajectories are possible. In general, the best (broadband) match is achieved when each end-point of the S22 path is close to the center of the Smith chart (50-Ohm point). Thus, the search strategy should choose the path that is closest to the center of the smith chart to get to $\Gamma_L$*.

Figure 8:
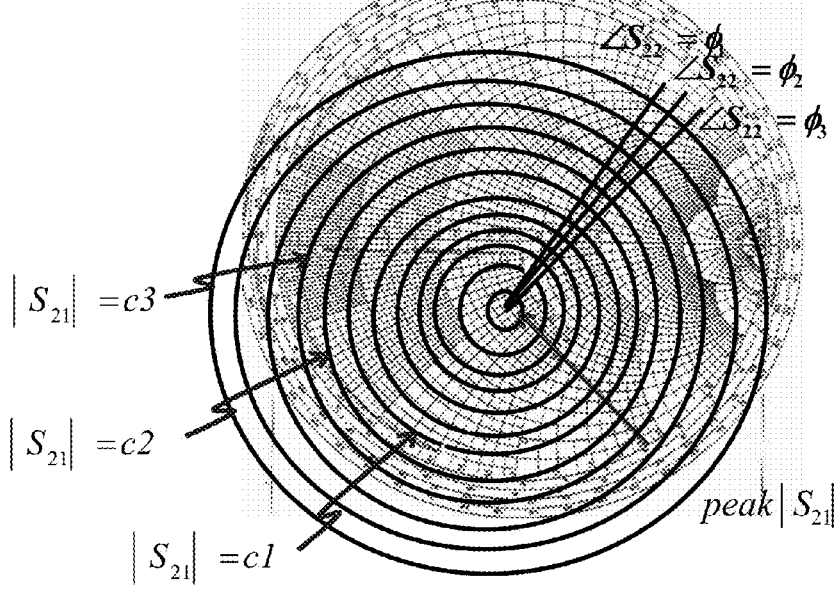
FIG. 8 illustrates one embodiment of establishing a Lookup Table (LUT) for codewords.

FIG. 8 illustrates one embodiment of establishing a Lookup Table (LUT). As illustrated in FIG. 8, the LUT can be organized for codewords based on constant S21 values or equivalent S22 constant circle (e.g., every 0.25 dB of |S21|) and equal angle ∠S22 (e.g., every 10 degree). In the example of FIG. 8, the contours of constant |S21| are plotted including |S21|=c1, |S21|=c2, |S21|=c3, etc. In addition, S22 equal angles are plotted including ∠S22=ϕ1, ∠S22=ϕ2, ∠S22=ϕ3, etc. A simple way to reduce the LUT size is to select points on the |S21| constant contours and the S22 equal angles. If multiple codewords correspond to the same |S21|, then eliminate the ill-conditioned ones under the following criteria: 1) choose the one with good input match; 2) choose the one with good S22 (close to the center of the Smith chart; and 3) choose the one with good capacitor values (not overall small).

Figure 9:
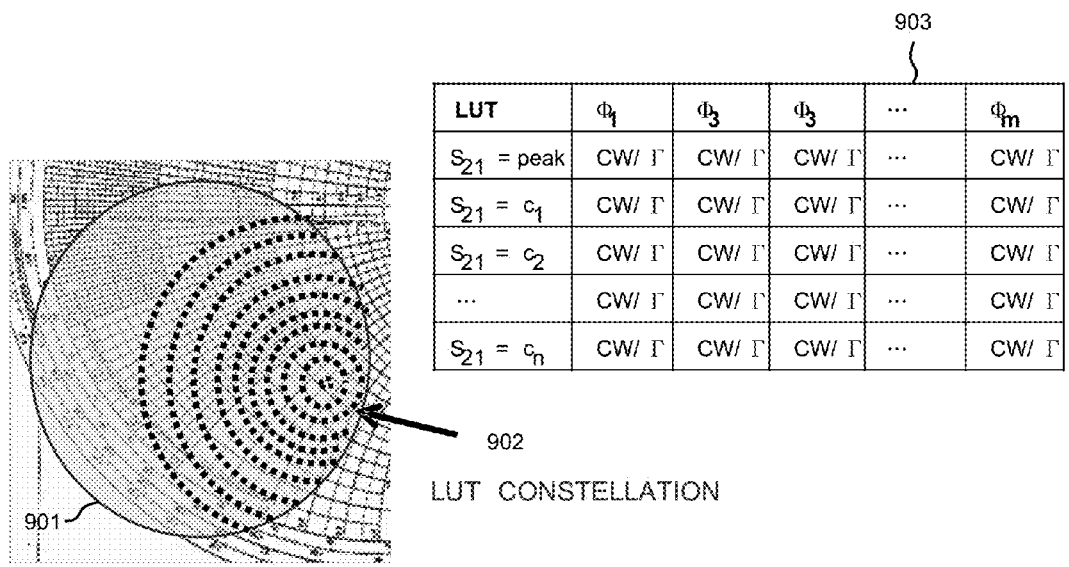
FIG. 9 illustrates one example of a lookup table for codewords based on S21 quantization within the search region.

FIG. 9 illustrates an example of a Lookup Table (LUT) for codeword based on S21 quantization within the search region. The search region is a circle 901 that satisfies the same condition as depicted by equation (1). The search region can be pre-computed based on the condition because it is independent from the load condition of antenna. The contours of constant |S21|=Cn (e.g., every −0.25 dB of |S21|) and equal angle ∠S22=ϕn (e.g., every 10 degree) within the search region 901 can also be pre-computed and plotted on the Smith chart, which results in an LUT constellation 902 as depicted. Based on the LUT constellation, LUT 903 is organized for codewords as well as corresponding input matching Γ. For example, each row corresponds to |S21|=cn, while column corresponds to ∠S22=ϕn. In one embodiment, if there are multiple codewords corresponding to a certain |S21| value, then the codeword that gives the broadband |S21| is selected. In another embodiment, if $\Gamma_L^*$ is outside of the search region, then the search path is limited to the search region to restrict the LUT size.

Figure 10:
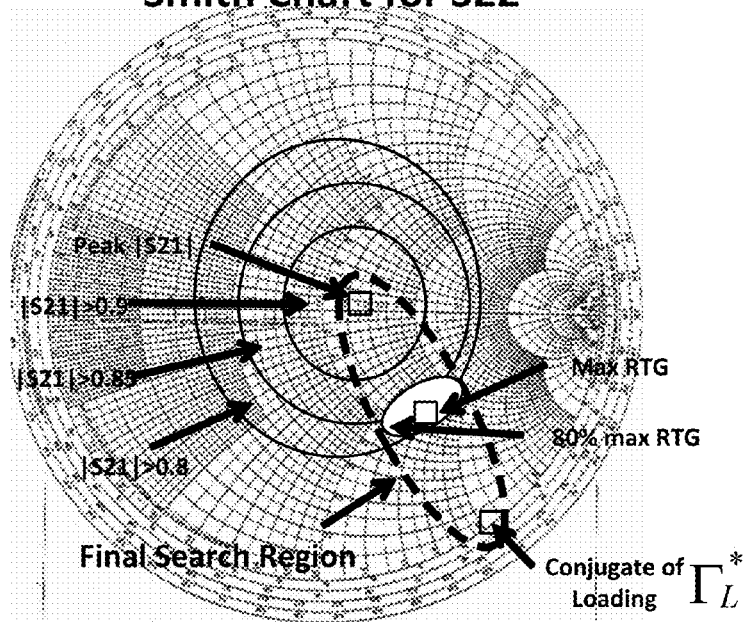
FIG. 10 illustrates one example of search strategy for maximum RTG.

FIG. 10 illustrates one example of search strategy for maximum RTG. First, |S21| regions can be pre-computed and picking equal contour→codewords. The peak of |S21| and the conjugate of loading defines an elliptical final search region. The pre-computed codewords can be further filtered out (whether in this elliptical final search region). Finally, RTG search is performed on this set of filtered codewords.

In one example, the search is performed by finding the direction of search angel ϕi, which is the direction from the peak |S21| to $\Gamma_L^*$:

$$\phi_i = \angle(S_{21,peak} - \Gamma_L^*)$$

Search the LUT corresponding to the column ϕi. For selected codeword, check if |Γin| is within an allowable limit. Continue to refined-search with hill climbing algorithm to increase RTG.

A more refined search is to incorporate output mismatch into the search after the initial search is done:

$$G_T = \frac{\text{Deliver powe to Load}}{\text{Available Power from Source}}$$

$$= \frac{(1 - |\Gamma_s|^2)}{|1 - \Gamma_s \Gamma_{in}|^2} |S_{21}|^2 \frac{(1 - |\Gamma_L|^2)}{|1 - S_{22}\Gamma_L|^2}$$

$$= \text{input mismatch} \cdot |S_{21}|^2 \text{output mismatch}$$

Given $\Gamma_{L\_estimated}$, we can compute output mismatch for different code words around the initial search result to find higher RTG value. If the source mismatch $\Gamma_s \neq 0$, we can search different codewords around the initial search result to find higher RTG value based on:

$$\frac{(1 - |\Gamma_s|^2)}{|1 - \Gamma_s \Gamma_{In\_Estimated}|^2} |S_{21}|^2 \frac{(1 - |\Gamma_{L\_Estimated}|^2)}{|1 - S_{22}\Gamma_{L\_Estimated}|^2}$$

Figure 11:
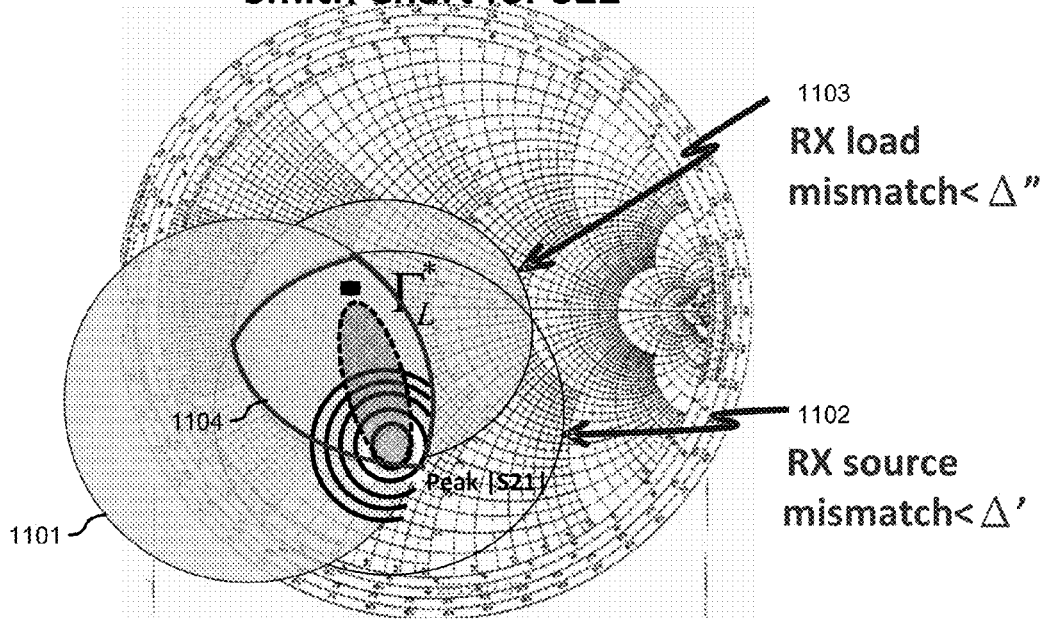
FIG. 11 illustrates search region that is constrained by receiver mismatch.

FIG. 11 illustrates search region that is constrained by receiver mismatch. The receiver mismatch can occur because of transmit path RTG optimization. At the receiver, the load is known a prior but the current source conditions (antenna side) is not known a priori. The strategy for maintaining a reasonable receiver match is to restrict the search region in TX S22 to region where receiver source and load match do not deviate significantly from the 50-Ohm point. That is, to prevent excessive receiver mismatch, we can limit the search region within the overlapping area of TX search region, small RX source mismatch region, and small RX load mismatch region. In the example of FIG. 11, the TX search region is depicted by circle 1101 on the Smith chart, the small RX source mismatch is depicted by circle 1102 which indicates RX S11<Δ', and the small RX load mismatch is depicted by circle 1103 which indicates RX S22<Δ". The restricted region of RX S11<Δ' and RX S22<Δ" within the TX search region 1101 can be pre-computed, resulting an overall search region as depicted by 1104. By overlapping the receiver restricted region and the TX S22 search region on the Smith chart, the overall search region provides good TX RTG while maintaining reasonable RX path match. Note that not all the constraints need to be active at the same time. For example, in low band case, the input constraint might not be important because the max RTG corresponds to a Gamma_in not so close to zero.

Figure 12:
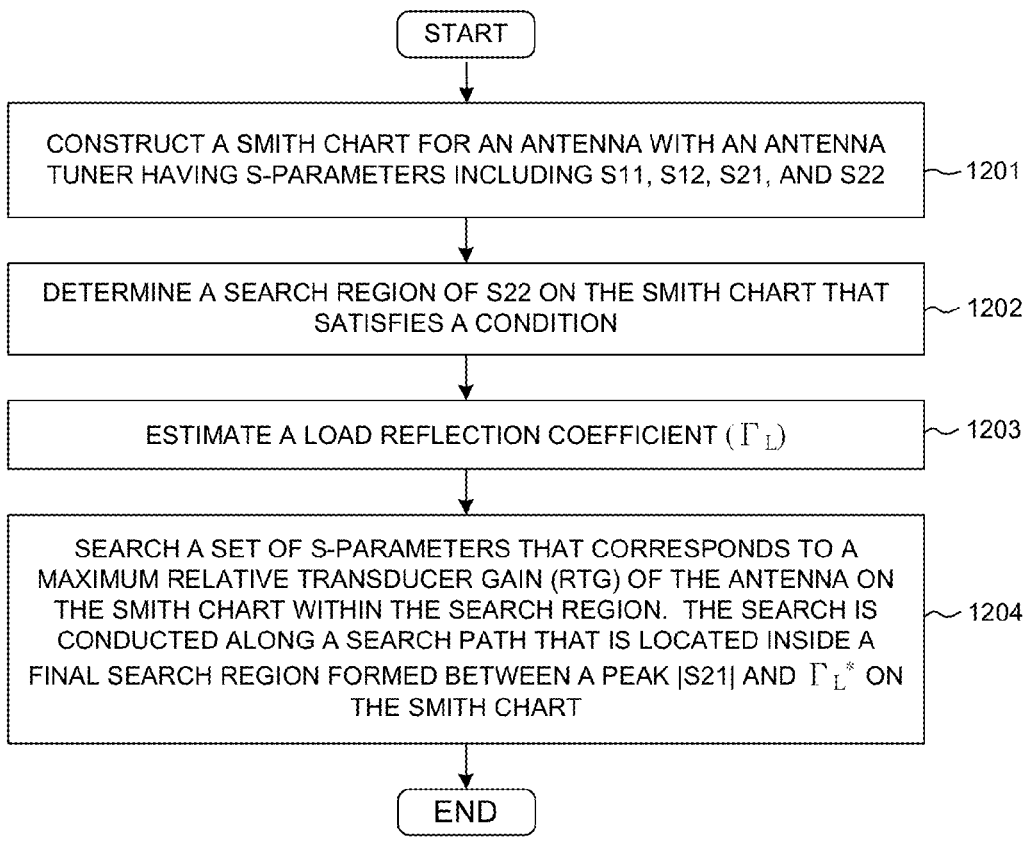
FIG. 12 is a flow chart of a method of simplified closed-loop antenna tuning (CLAT) algorithm in accordance with one novel aspect.

FIG. 12 is a flow chart of a method of simplified closed-loop antenna tuning (CLAT) algorithm in accordance with one novel aspect. In step 1201, a wireless device construct a Smith chart for an antenna with an antenna tuner having S-parameters including S11, S12, S21, and S22. In step 1202, the wireless device determines a search region of S22 on the Smith chart that satisfies a condition. The search region is pre-computed because the condition is independent from the load condition of the antenna tuner and properly quantized. In one embodiment, the condition indicates an input reflection coefficient (Γin) of the antenna tuner is smaller than a threshold value. In step 1203, the wireless device estimates a load reflection coefficient ($\Gamma_L$) of the antenna tuner. In step 1204, the wireless device searches a set of S-parameters that corresponds to a maximum relative transducer gain (RTG) of the antenna on the Smith chart within the search region. The search is conducted along a search path that is located inside a final search region formed between a peak |S21| and $\Gamma_L^*$ on the Smith chart. In one embodiment, a simple gradient search can be used to further refine the search.

Although the present invention has been described in connection with certain specific embodiments for instructional purposes, the present invention is not limited thereto. Accordingly, various modifications, adaptations, and combinations of various features of the described embodiments can be practiced without departing from the scope of the invention as set forth in the claims.

What is claimed is:

1. A method comprising:
   (a) constructing a Smith chart by a wireless device for an antenna with an antenna tuner having S-parameters;
   (b) determining a search region based on an S-parameter on the Smith chart that satisfies a condition, wherein the search region is pre-calculated independent from a load condition of the antenna tuner;
   (c) estimating a load reflection coefficient ($\Gamma_L$) of the antenna tuner; and (d) searching a set of S-parameters that corresponds to a maximum relative transducer gain (RTG) of the antenna within the search region, wherein the search is conducted along a pre-defined search path located inside a final search region that is formed between a peak |S21| and $\Gamma_L^*$ on the Smith chart.

2. The method of claim 1, wherein an RTG value is defined as a ratio between an incident power to the antenna with the antenna tuner and an incident power to the antenna without the antenna tuner.

3. The method of claim 1, wherein the S-parameter is S22.

4. The method of claim 1, wherein the condition indicates an input reflection coefficient ($\Gamma$in) of the antenna tuner is smaller than a threshold value.

5. The method of claim 1, wherein the antenna tuner comprises a plurality of capacitors and a plurality of inductors, and wherein the S-parameters are functions of codewords representing settings of the capacitors and the inductors.

6. The method of claim 5, wherein a reduced size lookup table (LUT) between the S-parameters and the codewords is constructed within the search region based on a pre-determined method.

7. The method of claim 6, wherein the LUT size is further reduced by selecting points on or closest to the constant |S21| contours and equal S22 angles on the Smith chart.

8. The method of claim 1, wherein the $\Gamma_L^*$ is estimated based on measurements of an input reflection coefficient ($\Gamma$in) of the antenna tuner.

9. The method of claim 8, wherein a coupler and a detector are used to sample a forward path and a reverse path of radio signals for determining the input reflection coefficient ($\Gamma$in) of the antenna tuner.

10. The method of claim 1, wherein the search stops at the border of the search region if the $\Gamma_L^*$ is located outside of the search region.

11. The method of claim 1, wherein another simple gradient type search is used to refine the search after the pre-defined search path is completed.

12. The method of claim 1, wherein the search region is further constrained by a receiver source mismatch condition and a receiver load mismatch condition.

13. The method of claim 1, wherein a first search region is defined for a first carrier frequency, and wherein a second search region is defined for a second carrier frequency.

14. A wireless device, comprising:
a processor;
an antenna;
an antenna tuner having S-parameters, wherein the antenna tuner load is coupled to the antenna, and wherein the antenna tuner source is coupled to an RF transceiver;
a coupler and a detector that samples a forward path and a reverse path of radio signals to determine an input reflection coefficient; and
a control interface that controls settings of the antenna tuner by the processor via a digital baseband general purpose IO (DBB GPIO), wherein a pre-determined search region of an S-parameter on the Smith chart that satisfies a condition is stored in the processor, the said processor estimates a load reflection coefficient ($\Gamma_L$) of the antenna tuner, searches a set of S-parameters that corresponds to a maximum relative transducer gain (RTG) of the antenna within the search region, wherein the search region is pre-calculated independent from a load condition of the antenna tuner, and wherein the search is conducted along a search path located inside a final search region that is formed between a peak |S21| and $\Gamma_L^*$ on the Smith chart.

15. The device of claim 14, wherein an RTG value is defined as a ratio between an incident power to the antenna with the antenna tuner and an incident power to the antenna without the antenna tuner.

16. The device of claim 14, wherein the condition indicates an input reflection coefficient ($\Gamma$in) of the antenna tuner is smaller than a threshold value.

17. The device of claim 14, wherein the antenna tuner comprises a plurality of capacitors and a plurality of inductors, and wherein the S-parameters are functions of codewords representing settings of the capacitors and the inductors.

18. The device of claim 17, wherein a reduced size lookup table (LUT) between the S-parameters and the codewords is constructed within the search region.

19. The device of claim 18, wherein the LUT size is further reduced by selecting points on or closest to constant |S21| contours and equal S22 angles on the Smith chart.

20. The device of claim 14, wherein the $\Gamma_L^*$ is estimated based on measurements of an input reflection coefficient ($\Gamma$in) of the antenna tuner.

21. The device of claim 14, wherein the search stops at the border of the search region if the IV is located outside of the search region.

22. The device of claim 14, wherein the search region is further constrained by a receiver source mismatch condition and a receiver load mismatch condition.

23. The device of claim 14, wherein a first search region is defined for a first carrier frequency, and wherein a second search region is defined for a second carrier frequency.

* * * * *